United States Patent [19]

Clark

[11] 4,325,097
[45] Apr. 13, 1982

[54] FOUR TERMINAL PULSE SUPPRESSOR

[75] Inventor: O. Melville Clark, Tempe, Ariz.

[73] Assignee: General Semiconductor Industries, Inc., Tempe, Ariz.

[21] Appl. No.: 75,961

[22] Filed: Sep. 17, 1979

[51] Int. Cl.³ .............................................. H02H 9/04
[52] U.S. Cl. ........................................ 361/56; 361/91; 361/118; 361/111
[58] Field of Search .................. 361/56, 119, 118, 91, 361/110, 111, 127; 338/20, 21; 174/52 R, 52 PE

[56] References Cited

U.S. PATENT DOCUMENTS

| 3,452,252 | 6/1969 | Mapham | 361/118 X |
| 3,743,996 | 7/1973 | Harnden, Jr. | 361/56 X |
| 3,934,175 | 1/1976 | Clark | 361/56 |
| 4,217,619 | 8/1980 | Tibolla | 361/56 |

FOREIGN PATENT DOCUMENTS

| 2538919 | 3/1977 | Fed. Rep. of Germany | 361/127 |
| 1177899 | 1/1970 | United Kingdom | 361/91 |

*Primary Examiner*—Patrick R. Salce

*Attorney, Agent, or Firm*—Cahill, Sutton & Thomas

[57] ABSTRACT

A solid state electromagnetic pulse suppressor includes first and second external input terminals and first and second external output terminals. The pulse suppressor also includes first and second conductors. The first conductor is electrically connected between the first input terminal and the first output terminal. The second conductor is electrically connected between the second input terminal and the second output terminal. A pulse suppressor element having first and second electrodes has its first electrode attached to an intermediate portion of the first conductor and has its second electrode attached to an intermediate portion of the second conductor. The pulse suppressor element and the portions of the first and second conductors attached thereto are contained in a package. In use, the four terminal pulse suppressor connected in series connection with first and second electrical lines, thereby presenting negligeable inductance between the electrical lines and the pulse suppressor chip and limiting high speed transient voltages across the first and second input terminals.

3 Claims, 9 Drawing Figures

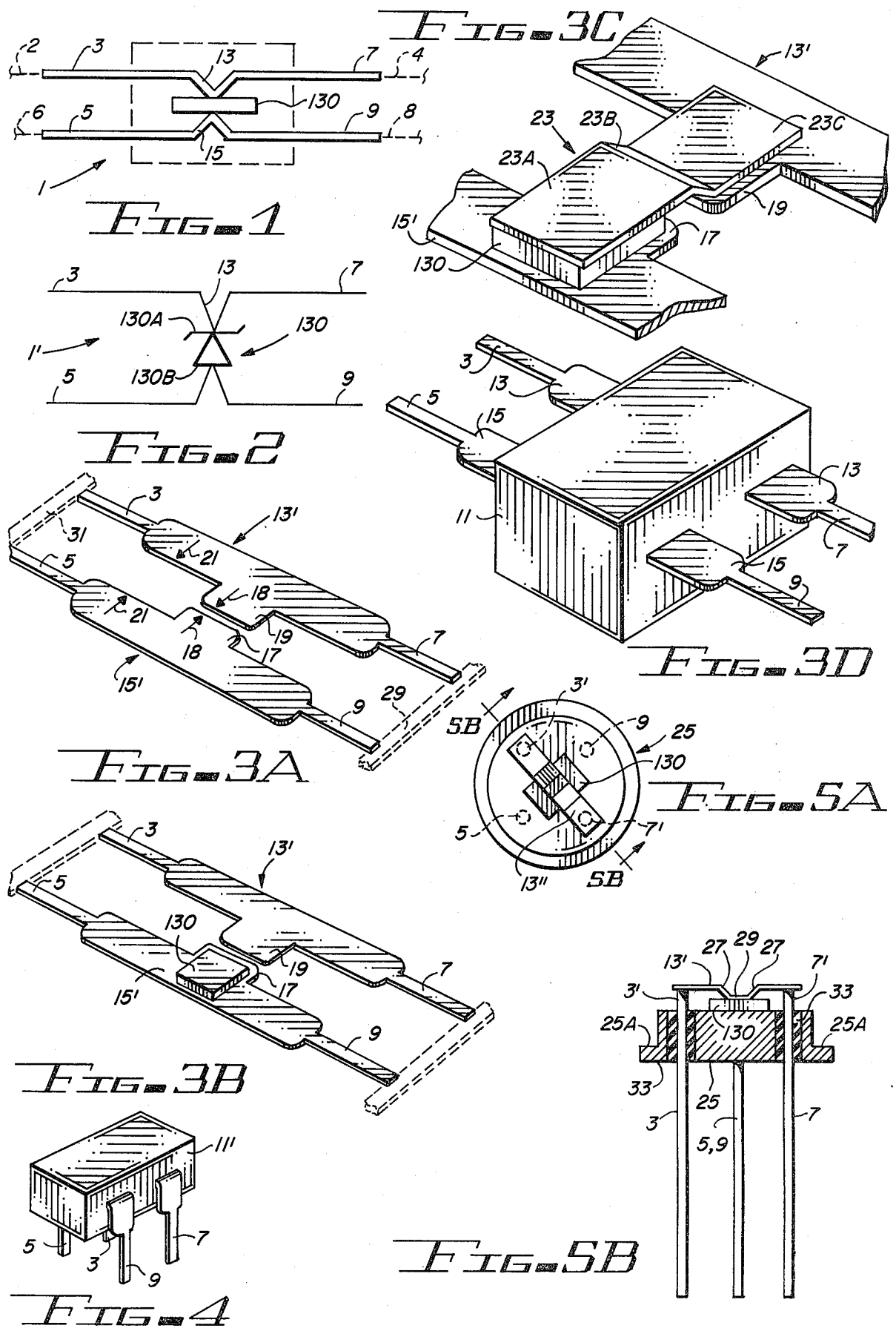

FOUR TERMINAL PULSE SUPPRESSOR

BACKGROUND OF THE INVENTION

1. Field of the Invention

The invention relates to electromagnetic pulse suppressor devices, and more particularly to extremely low inductance electromagnetic pulse suppressor devices.

2. Description of the Prior Art

Various kinds of power surges frequently occur in electrical conductors of electronic systems. Such power surges are frequently capable of destroying electronic components, rendering the electronic systems inoperative, and sometimes causing disasterous consequences. Various prior art devices for protecting electrical equipment against such transient power surges have been proposed. Semiconductor PN junction devices connected in circuitry to operate in the reverse breakdown or avalanche mode commonly have been packaged and connected in various configurations to suppress transient voltage surges which would otherwise destroy expensive electronic equipment. For example, see my U.S. Pat. No. 3,934,175 assigned to the present assignee.

Prior art surge suppression devices operate quite satisfactorily for certain types of power surges, especially those having relatively slow rise times. However, certain types of high voltage power surges or transient pulses, especially those caused by electrostatic discharges (ESD) and electromagnetic pulses, have extremely high speed rise times, of the order of kilovolts per nanosecond. Such high speed voltage voltage pulses can frequently cause destruction of a sensitive electronic circuit component, such as a MOS integrated circuit device, before the prior art surge depression devices can react to the extremely high speed transient pulses. The slow response of prior surge suppressors is mainly due inductance associated with their electrical lead connections. In the prior art surge suppressors, the electrical leads consist of a pair of lead conductors which extend from electrical lines conducting a power surge to the electrodes of the solid state avalanche mode PN junction devices which are the heart of the prior art surge suppressors. For more information on this topic, see the following references:

1. E. Van Keuren, Effects of EMP Induced Transients on Integrated Circuits, IEEE Electromagnetic Compatability Symposium Record, 75CH1002-5 EMC, 1975.

2. Owen J. McAteer, Shocking Blow to Military Electronics, Military Electronics/Countermeasures, June 1979.

3. T. J. Tucker, Spark Initiation Requirements of a Secondary Explosive, Annals of the New York Academy of Sciences, Volume 152, Article I, pp. 643-653, 1968.

4. O. Melville Clark, Suppression of Fast Rise-time Transients, Proceedings of 1st Symposium and Technical Exhibition on Electromagnetic Compatibility, IEEE 75CH1012-4 MONT, Montreux, Switzerland, 1975.

Accordingly, it is an object of the invention to provide a power surge protection device which is capable of effectively suppressing transient energy pulses or power surges having extremely high speed rise times.

It is another object of the invention to provide a power surge suppression device having extremely low inductance coupling between an electrical line conducting a power surge and a solid state PN junction suppressor chip.

Previously, when a large percentage of electronic devices is used consisted of "discrete" solid state components and "first generation" integrated circuit devices, average node capacitances of the circuitry were sufficiently high that the node capacitances could effectively suppress ordinary high voltage, high speed power surges, thereby preventing destruction of electronic components. However, in recent years tremendous reductions size of integrated circuits has occurred greatly reducing node capacitances. The great reductions in cost of electronic circuitry which have resulted from steadily increased miniaturization of integrated circuits has resulted in pervasive use of electronics throughout most segments of industry.

It is well known that the human body (which typically has a capacitance of 150 to 200 picofarads) frequently stores electrostatic charge which may be accumulated by walking on carpets, etc. Frequently, a person's body will be 30,000 to 40,000 volts different than the voltage of an object which the person touches. The resulting electrostatic discharge produces extremely fast rise time, high voltage transient voltages which are often coupled to electronic equipment. With the above mentioned pervasive use of electronic equipment, electrostatic discharge due to human bodies is causing increasing numbers of completely unanticipated electronic circuit failures, sometimes with disasterous consequences. Up to now, however, the electronics industry has not been able to provide a reliable, widely applicable protection system for protecting delicate electronic circuitry against such high speed, high voltage transients. Although large capacitances can sometimes be connected to power supply conductors to suppress such high speed, high voltage transients, frequently such capacitances are completely unacceptable.

Accordingly, it is another object of the invention to provide a power surge suppression device which economically and effectively suppress and dissipates voltage transients produced by electrostatic discharge from human bodies.

SUMMARY OF THE INVENTION

Briefly described, and in accordance with one embodiment thereof, the invention provides an electrical surge suppressor for suppressing extremely high speed, high voltage, transient power pulses. The surge suppressor includes a semiconductor junction device disposed in a semiconductor package. Four terminals, including two input and two output terminals, extend from the package. A first conductor in the semiconductor package is electrically attached to one electrode of the semiconductor junction device and is also electrically connected to the first input terminal and the first output terminal. A second conductor in the semiconductor package is electrically attached to a second electrode of the semiconductor junction device and is also electrically connected to the second input terminal and the second output terminal. In use, the surge suppressor is connected in series with a parallel electrical line for which surge suppression is required, so that all of the current normally flowing through a first one of the electrical lines flows through the first conductor, and all of the current normally flowing through the second electrical line flows through the second conductor.

In one embodiment of the invention, the first and second conductors are coplanar spaced metal strips cut from a lead frame assembly. First and second tabs extend inwardly from the first and second strips, a narrow gap separating the innermost edges of the tabs. The semiconductor junction device has a bottom electrode which is bonded to the first tab. A highly conductive metal crossover strip is attached to a top electrode of the semiconductor junction device and to the upper surface of the second tab.

In another embodiment of the invention, the first conductor is a conductive header of a metal semiconductor package. The first input terminal and the first output terminal are rigidly electrically attached to the metal header. The second input terminal and the second output terminal extend through insulated openings in the metal header, forming posts in the interior of the package. A bottom electrode of the semiconductor junction device is electrically attached to the upper surface of the header. A conductive strip is electrically attached to the top of the posts and to a top electrode of the semiconductor junction device. A metal cap is hermetically sealed to a flange of the metal header.

BRIEF DESCRIPTION OF THE DRAWINGS

FIG. 1 is a schematic drawing useful in describing the present invention.

FIG. 2 is an electrical schematic drawing representing the device of FIG. 1.

FIGS. 3A–3D disclose the structure of a first embodiment of the invention at different stages of making the first embodiment.

FIG. 4 discloses a perspective view of the completed device shown in FIGS. 3A–3D.

FIG. 5A discloses a top view of a second embodiment of the invention.

FIG. 5B is a section view taken along section lines 5B—5B of FIG. 5A.

DESCRIPTION OF THE INVENTION

Referring now to FIG. 1, surge suppressor 1 includes input leads or terminals 3 and 5 and also includes output leads or terminals 7 and 9. Leads 3, 5, 7, and 9 all extend from the exterior of package 11 to the interior thereof. Silicon junction suppressor 130 is disposed within the interior of package 11. Leads 3 and 7 are jointed by a V-shaped conductor 13 which contacts one electrode of silicon junction suppressor 13. Similarly, leads 5 and 9 are connected by V-shaped conductor 15, which electrically contacts the second electrode of silicon junction suppressor 130.

Silicon junction suppressor 130 can be a silicon junction suppressor marketed by the present assignee under the trademark TRANZORB, and includes a silicon semiconductor chip 13 haveing a PN junction and metalized surface areas for making electrical contact to both sides of the PN junction. The avalanche breakdown voltage may be approximately 6.8 volts.

It will be readily recognized that under DC conditions all of the current (except a negligible PN junction leakage current) flowing into input terminal 3 flows through V-shaped conductor 13 and out of output lead 7. Similarly, under DC conditions all of the current flowing into input lead 5 flows through V-shaped conductor 15 and out of conductor 9.

FIG. 2 discloses an electrical schematic diagram of the surge suppressor device shown in FIG. 1. The diagram in FIG. 2 clarifies that junction suppressor chip 130 has a cathode 13A and anode 130B. Cathode 130A is electrically connected to the tip of V-shaped conductor 13. The anode 13B is electrically connected to the tip of V-shaped conductor 15.

The proper method of connecting the surge suppressor of the present invention to a pair of electrical lines which need surge protection is to insert the surge suppressor in series connection. The dotted lines 2, 4, 6 and 8 in FIG. 1 illustrate schematically the method of connecting surge suppressor 1 in the proper series connection. Dotted lines 2 and 4 represent separate portions of one of the above mentioned electrical lines. Dotted lines 6 and 8 represent separate portions of the second electrical line.

Thus, all of the DC current in electrical line 2, 4 flows into package 11 via lead 3, through V-shaped conductor 13 to a point very close to one electrode of surge suppressor chip 130, and out of package 11 via lead 7.

Similarly, all of the DC current flowing in electrical line 6, 8 flows into package 11 via lead 5, very close to a second electrode of surge suppressor chip 130, and out of package 11 via lead 9.

Thus, the main current flow of any high-speed, high voltage transient pulse conducted along electrical line sections 2 and 6 experiences virtually zero delay in reaching surge suppressor chip 130 after the surge reaches package 11. This prevents the surge from propagating further along electrical line sections 4 and 8 to destroy any sensitive electrical circuitry connected thereto before the transient surge can reach surge suppressor 130 and be suppressed.

In accordance with one preferred embodiment of the invention, the surge suppressor of the present invention is embodied in a dual-in-line (DIP) package having a completed configuration as shown in FIG. 4.

FIGS. 3A–3D show different stages of construction of the surge suppressor of FIG. 4.

Identical reference numerals to those used above with reference to FIGS. 1 and 2 are utilized in the following description to identify corresponding parts in the device shown in FIGS. 3A–3D. Referring now to FIG. 3A, one portion of a lead frame is illustrated. End sections 29 and 31 are later clipped away, and therefore shown in dotted lines.

A first lead frame member includes leads 3 and 7. A relatively wide body strip 13' connects leads 3 and 7, and is integrally formed therewith. A tab 19 coplanar with main body 13' and leads 3 and 7 extends inwardly from body strip 13'.

A second lead frame member includes a wide conductive body strip 15' coplanar and integral with and connecting leads 5 and 9. A tab 17 coplanar with body strip 15' extends inwardly toward tab 19.

The entire lead frame can be made from a variety of highly conductive metal material of the type widely used in the semiconductor industry in making dual-in-line packages for integrated circuits.

Leads 5 and 9 are axially aligned, as are leads 3 and 7. Body strips 13' and 15' are parallel. A narrow gap of approximately 40 mils (indicated by arrows 18) separates the parallel inner edges of tabs 17 and 19. The spacing between the inner edges of body strips 15' and 13' is much greater than gap 18, as indicated by arrow 21.

Referring now to FIG. 3B and silicon suppressor die or chip 13 is electrically bonded to tab 17 (which may be roughly 140 mils wide) and an adjacent portion of the upper surface area of body strip 15' by utilizing bonding techniques, such as soldering, which are very well known in the semiconductor industry.

Referring now to FIG. 3C, crossover bar 23 is bonded to the top metalized surface of silicon suppressor chip 13 and is also bonded to the upper surface area of tab 19.

Crossover bar 23 includes two parallel sections 23A and 23C which are connected by a sloped section 23B. Sloped section 23B compensates for the difference in height of the upper surface of tab 19 and the upper metalized surface of suppressor chip 130. Again, completely conventional soldering or die bonding techniques can be utilized to effect extremely low resistance electrical connections between crossover bar 23 and the metalized upper electrode of suppressor chip 130 and the upper surface of metal tab 19. Crossover bar 23 is preferrably selected to have a thermal coefficient of expansion which avoids undue stresses on the electrical connection during thermal cycling of surge suppressor 1.

Next, a plastic or ceramic encapsulation material 11' is formed around the structure shown in FIG. 3C to produce the structure shown in FIG. 3D. The techniques for performing this operation are very well known in the semiconductor industry, and therefore need not be set forth in detail herein.

Finally, the lead frame and portions 29 and 31 of the lead frame are clipped off. The portions of body strips 15' and 13' extending beyond encapsulation material 11' are bent, resulting in the device shown in FIG. 4.

The inductance between body strip 15' and the bottom electrode of suppressor chip 13 is negligible. Accordingly, there is no measurable time delay in conducting even a very highspeed, high voltage transient pulse from body strip 15' to surge suppressor chip 130.

Due to the flat configurations of tab 19 and crossover bar 23, the total series inductance of tab 19 and crossover strip 23 is also virtually zero. The measured inductance across either terminals 3 and 5 or terminals 7 and 9 has been measured and found to be less than 10-9 henrys. Accordingly, there is no significant delay in conducting a high-speed, high voltage transient pulse from body strip 13' to the upper electrode of surge suppressor chip 130.

It has been found that the above described embodiment of the invention is capable of suppressing or reducing a 2,000 volt pulse having a rise time rate of 4 kilovolts per nonosecond applied across electric lines 2 and 6 to a 9 volt pulse, wherein surge suppressor chip 130 has a reverse breakdown voltage of 6.8 volts. No prior art surge suppressor is known to be capable of this degree of suppression of high-speed, high voltage transient pulses.

It should be noted that the DIP configuration permits the device to be readily utilized in printed circuit boards containing delicate electronic circuitry, such as CMOS and MOSLSI integrated circuits.

Referring now to FIGS. 5A and 5B, in an alternate embodiment of the invention, surge suppressor chip 13 is packaged in a TO-5 type package 25. Surge suppressor chip 130 is bonded to conductive header 25. Leads 5 and 9 are rigidly electrically connected to the bottom of header 25.

Leads 3 and 7 extend through electrical insulation 33. Ends 3' and 7' of leads 3 and 7, respectively, form rigid posts which extend above the upper surface of header 25.

A highly conductive metal strip 13" electrically connects the upper electrode of surge suppressor chip 130 to the tops of posts 3' and 7'. Conductive strip 13" includes two downwardly sloped portions 27 and a horizontal bottom portion 29. Bottom portion 29 is electrically connected to the top metalized electrode of surge suppressor chip 130. A conventional metal cap (not shown) is hermetically sealed to flange 25A.

The advantages described above with respect to the embodiment of FIGS. 3A–3D also apply to the embodiment of FIGS. 5A and 5B. More specifically, the inductance of header 25 is virtually zero. All of the DC current (except for a negligible leakage current across the PN junction of surge suppressor chip 13) flowing through leads 3 and 7 also flows through conductive strip 13". Virtually zero inductance exists between bottom portion 29 of conductive strip 13" and the upper electrode of surge suppressor chip 130.

Thus, the embodiment of FIGS. 5A and 5B overcomes the main problem of the prior art, namely the problem of delay in conducting an extremely fast, high-voltage surge from a pair of electrical lines to which the surge suppressor of FIGS. 5A and 5B is connected to the surge suppressor chip 130.

While the invention has been described with reference to several particular embodiments thereof, those skilled in the art will be able to make various obvious modifications to the disclosed embodiments without departing from the true spirit and scope of the invention. For example, the surge suppressor chip 130 can be replaced by various other types of voltage limiting devices, including gas surge arrestors, metal oxide arrestors, silicon carbide surge arrestors and niobium oxide surge arrestors. As another example, the lead frame embodiment of FIGS. 3A–3D could be modified so that the lead frame member criss-cross, are being attached to the top chip electrode and the other being attached to the bottom chip electrode to further reduce internal inductance of the surge suppressor.

I claim:

1. A surge suppressor for limiting high-speed, high voltage power surges conducted between first and second electrical lines, said surge suppressor comprising in combination:
  a. a package, said package having a cavity therein;
  b. a semiconductor junction device that operates in a junction avalanche mode, said semiconductor junction device being disposed in said package, said semiconductor junction device having first and second electrodes;
  c. first and second terminals located outside of said package;
  d. a first conductor for conducting substantially all line current through said first line, said first conductor extending through the interior of said package, said first conductor having a first substantially V-shaped intermediate portion disposed inside said package, said first substantially V-shaped intermediate portion having a central tip portion attached to and electrically connected to said first electrode of said semiconductor junction device, said first substantially V-shaped intermediate portion having two opposed end portions electrically connected to said first and second terminals, respectively;
  e. third and fourth terminals located outside of said package; and
  f. a second conductor for conducting substantially all line current flowing through said second conductor, said second conductor extending through the interior of said package, said second conductor having a second intermediate portion disposed inside said package and attached to and electrically connected to said second electrode of said semiconductor junction device, said second conductor having two opposed end portions electrically connected to said third and fourth terminals, respectively.

2. A surge suppressor for limiting high-speed high voltage power surges conducted between first and second electrical lines, said surge suppressor comprising in combination:
 a. a package, said package having a cavity therein;
 b. a semiconductor junction device disposed in said package, said semiconductor junction device having first and second electrodes, wherein said semiconductor junction device contains a PN junction which operates in an avalanche mode in order to limit the high-speed, high voltage power surges;
 c. first and second terminals located outside of said package;
 d. a first conductor extending through the interior of said package, said first conductor having an intermediate portion electrically connected to said first electrode, said first conductor being electrically connected between said first and second terminals, wherein said first conductor includes a metal header, said semiconductor junction device having a bottom electrode being electrically attached to the upper surface of said metal header, said first and second terminals including leads rigidly attached to the bottom surface of said metal header;
 e. third and fourth terminals located outside of said package;
 f. a second conductor extending through the interior of said package, said second conductor having an intermediate portion electrically connected to said second electrode, said second conductor being electrically connected between said third and fourth terminals;
 g. first and second electrically insulating means through which said third and fourth terminals extend from the bottom surface to the top surface of said metal header, upper end portions of said third and fourth leads forming posts extending above the top surface of said metal header, said surge suppressor further including a conductive strip electrically attached to the tops of each of said posts and also electrically attached to a top electrode of said semiconductor junction device, whereby said surge suppressor can be connected between first and second portions of each of said first and second electrical lines, respectively.

3. A surge suppressor for limiting high speed, high voltage power surges conducted between first and second electrical lines, said first and second electrical lines each including a first section and a separate second section, said surge suppressor comprising in combination:
 a. a package, said package having a cavity therein;
 b. a semiconductor junction device disposed in said package, said semiconductor junction device having first and second electrodes;
 c. first and second terminals located outside of said package;
 d. a first conductor for conducting substantially all line current flowing through said first line, said first conductor extending through the interior of said package, said first conductor having a first intermediate portion located inside said package, said first conductor having opposed end portions electrically connected to said first and second terminals, respectively;
 e. connecting means, disposed inside said package and having substantially zero inductance, for electrically connecting said first intermediate portion to said first electrode;
 f. third and fourth terminals located outside of said package; and
 g. a second conductor for conducting substantially all line current flowing through said second line, said second conductor extending through the interior of said package, said second conductor having a second intermediate portion located inside said package, said second intermediate portion of said second conductor being directly attached to and electrically contacting said second electrode of said semiconductor junction device, said second conductor having opposed end portions electrically connected to said third and fourth terminals, respectively, whereby said surge suppressor can be inserted between said first and second sections of said first line and between said first and second sections of said second line by connecting said first terminal to said first section of said first line, said second terminal to said second section of said first line, said third terminal to said first section of said second line and said fourth terminal to said second section of said second line, wherein said second intermediate portion of said second conductor is substantially V-shaped.

* * * * *